(12) United States Patent
Wang

(10) Patent No.: US 11,545,552 B2
(45) Date of Patent: Jan. 3, 2023

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 84 days.

(21) Appl. No.: 17/104,218

(22) Filed: Nov. 25, 2020

(65) Prior Publication Data
US 2022/0028990 A1    Jan. 27, 2022

(30) Foreign Application Priority Data
Jul. 24, 2020   (CN) .......................... 202010725785.4

(51) Int. Cl.
*H01L 29/417*      (2006.01)
*H01L 21/033*      (2006.01)
(Continued)

(52) U.S. Cl.
CPC .... *H01L 29/41775* (2013.01); *H01L 21/0332* (2013.01); *H01L 29/0653* (2013.01);
(Continued)

(58) Field of Classification Search
CPC ...................... H01L 21/0332; H01L 29/41775
See application file for complete search history.

(56) References Cited

U.S. PATENT DOCUMENTS

2020/0075409 A1\*   3/2020   Wang .................. H01L 21/0332
2021/0098466 A1\*   4/2021   Liaw ............... H01L 21/823821

\* cited by examiner

*Primary Examiner* — Farun Lu
(74) *Attorney, Agent, or Firm* — Crowell & Moring, L.L.P.

(57) ABSTRACT

A semiconductor structure and a method for forming the same are provided. One form of a forming method includes: providing a base, the base including a device region and a dummy device region, the base including an isolation layer, gate structures located on the isolation layer, a first mask layer located on the gate structures, a source-drain plug located between the gate structures and on the isolation layer, and a second mask layer located on the source-drain plug. In implementations of the present disclosure, the first mask layer and the second mask layer on the dummy device region are separately removed. Correspondingly, the first opening and the second opening respectively expose the gate structures and the source-drain plug in the dummy device region. The gate structures exposed by the first opening and the source-drain plug exposed by the second opening are removed in the same step. The gate groove at the bottom of the first opening and the source-drain groove at the bottom of the second opening are formed at the same time. Correspondingly, a dielectric layer may be formed in the gate groove and the source-drain groove in the same step. The dielectric layer may block the gate structures and the source-drain plug at the same time. This is advantageous for simplifying the formation process of the semiconductor structure.

14 Claims, 5 Drawing Sheets

(51) Int. Cl.
*H01L 29/66* (2006.01)
*H01L 29/06* (2006.01)
*H01L 29/40* (2006.01)
(52) U.S. Cl.
CPC ...... *H01L 29/401* (2013.01); *H01L 29/41791* (2013.01); *H01L 29/66545* (2013.01)

SEMICONDUCTOR STRUCTURE AND METHOD FOR FORMING THE SAME

RELATED APPLICATIONS

The present application claims priority to Chinese Patent Appln. No. 202010725785.4, filed Jul. 24, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

With the continuous development of integrated circuit manufacturing technologies, people have increasingly high requirements on the integration level and performance of integrated circuits. To improve the integration level and reduce costs, critical dimensions of the components are continuously reduced, and the circuit density inside the integrated circuit is becoming increasingly high. Such a development trend makes the wafer surface unable to provide a sufficient area for fabricating required interconnection lines.

To meet the requirement of the interconnection lines after the critical dimensions are reduced, currently, the connection between different metal layers or between a metal layer and a base is implemented through an interconnection structure. The interconnection structure includes the interconnection lines and contact hole plugs formed inside a contact opening. The contact hole plugs are connected to a semiconductor device, and the interconnection lines implement connection between the contact hole plugs, so as to form a circuit. The contact hole plugs inside a transistor structure include a gate contact hole plug, which is located on a surface of a gate structure and configured to implement connection between the gate structure and an external circuit; and further include a source/drain contact hole plug, which is located on a surface of a source/drain doped layer and configured to implement connection between the source/drain doped layer and an external circuit.

Currently, to further reduce the transistor area, a contact over active gate (COAG) process is introduced. Compared with the conventional gate contact hole plug located above a gate structure of an isolation area, the gate contact hole plug can be fabricated above a gate structure of an active area (AA) using the COAG process, so as to further save the area of chip.

SUMMARY

A problem to be addressed in embodiments and implementations of the present disclosure is to provide a semiconductor structure and a method for forming the same, so as to optimize electrical performance of the semiconductor structure.

To address the foregoing problem, one form of the present disclosure provides a method for forming a semiconductor structure. The method includes: providing a base, the base including a device region and a dummy device region, the base further including an isolation layer, gate structures located on the isolation layer, a first mask layer located on the gate structures, a source-drain plug located between the gate structures and on the isolation layer, and a second mask layer located on the source-drain plug. The method further includes removing the first mask layer on the gate structures of the dummy device region, and forming, in the first mask layer, a first opening exposing the gate structures; removing the second mask layer on the source-drain plug of the dummy device region, and forming, in the second mask layer, a second opening exposing the source-drain plug; removing, using the remaining first mask layer and second mask layer as masks, the gate structures exposed by the first opening and the source-drain plug exposed by the second opening, forming a gate groove at the bottom of the first opening, and forming a source-drain groove at the bottom of the second opening; and forming a dielectric layer in the gate groove and the source-drain groove.

In some implementations, the first mask layer on the gate structures of the dummy device region is removed using a dry etching process.

In some implementations, in the step of removing the first mask layer on the gate structures of the dummy device region, an etched rate of the first mask layer is greater than that of the second mask layer.

In some implementations, a material of the first mask layer includes at least one of silicon nitride, silicon carbide, silicon carbonitride, silicon oxy-carbonitride, silicon oxynitride, boron nitride, or boron carbonitride.

In some implementations, the second mask layer on the source-drain plug of the dummy device region is removed using a dry etching process.

In some implementations, in the step of removing the second mask layer on the source-drain plug of the dummy device region, an etched rate of the second mask layer is greater than that of the first mask layer.

In some implementations, a material of the second mask layer includes at least one of silicon nitride, silicon carbide, silicon carbonitride, silicon oxy-carbonitride, silicon oxynitride, boron nitride, or boron carbonitride.

In some implementations, the step of removing the first mask layer on the gate structures of the dummy device region, and forming a first opening includes: forming a first shielding layer that covers the device region and exposes the first mask layer in the dummy device region; and removing the first mask layer in the dummy device region using the first shielding layer as a mask; and the method for forming a semiconductor structure further includes: removing the first shielding layer after the first mask layer in the dummy device region is removed.

In some implementations, the first opening is formed, and the second opening is formed after the first opening is formed; the step of removing the second mask layer on the source-drain plug of the dummy device region and forming the second opening includes: forming a second shielding layer that covers the first opening and the device region and exposes the second mask layer in the dummy device region; and removing the second mask layer in the dummy device region using the second shielding layer as a mask; and the method for forming a semiconductor structure further includes: removing the second shielding layer after the second mask layer in the dummy device region is removed.

In some implementations, using the remaining first mask layer and second mask layer as masks, the gate structures exposed by the first opening and the source-drain plug exposed by the second opening are removed using a dry etching process.

In some implementations, process parameters of removing, using the first mask layer and the second mask layer as masks, the gate structures exposed by the first opening and the source-drain plug exposed by the second opening include: an etching gas including one or two of $CH_3F$ and $SF_6$; a flow rate of the etching gas being in a range of 50 sccm to 500 sccm; an auxiliary gas including $O_2$; a chamber pressure being in a range of 5 mTorr to 200 mTorr; and an etching power being in a range of 50 W to 500 W.

In some implementations, in the step of providing a base, the base further includes: a substrate; and a fin, located on the substrate, where the isolation layer is located on the substrate on a side of the fin, and the isolation layer covers a part of side walls of the fin; the gate structures, on the isolation layer, span the fin and cover a part of a top wall and a part of side walls of the fin; the base further includes: a source-drain doped layer, located in the fin on two sides of the gate structures; the source-drain plug is located on the top of the source-drain doped layer; and the base further includes: an interlayer dielectric layer, located on the source-drain doped layer on sides of the gate structures, and a top surface of the interlayer dielectric layer is lower than or flush with that of the gate structures.

In some implementations, the method for forming a semiconductor structure further includes: forming a gate plug on the top of the gate structures after the dielectric layer is formed.

In some implementations, a material of the gate structures includes metal.

Another form of the present disclosure provides a semiconductor structure. The semiconductor structure includes: a base, including a device region and a dummy device region, the base including an isolation layer, gate structures located on the isolation layer, a first mask layer located on the gate structures, a source-drain plug located between the gate structures and on the isolation layer, and a second mask layer located on the source-drain plug; a first opening, located in the first mask layer, the first opening exposing the gate structures of the dummy device region; and a second opening, located in the second mask layer, the second opening exposing the source-drain plug of the dummy device region.

In some implementations, a material of the first mask layer includes at least one of silicon nitride, silicon carbide, silicon carbonitride, silicon oxy-carbonitride, silicon oxynitride, boron nitride, or boron carbonitride.

In some implementations, a material of the second mask layer includes at least one of silicon nitride, silicon carbide, silicon carbonitride, silicon oxy-carbonitride, silicon oxynitride, boron nitride, or boron carbonitride.

In some implementations, the base further includes: a substrate; and a fin, located on the substrate, where the isolation layer is located on the substrate on a side of the fin, and the isolation layer covers a part of side walls of the fin; the gate structures, on the isolation layer, span the fin and cover a part of a top wall and a part of side walls of the fin; the base further includes: a source-drain doped layer, located in the fin on two sides of the gate structures; the source-drain plug is located on the top of the source-drain doped layer; and the base further includes: an interlayer dielectric layer, located on the source-drain doped layer on sides of the gate structures, and a top surface of the interlayer dielectric layer is lower than or flush with that of the gate structures.

In some implementations, a material of the gate structures includes metal.

In comparison to the existing technology, the technical solutions of the embodiments of the present disclosure have the following advantages.

In forms of the method for forming a semiconductor structure provided the present disclosure, the base includes a device region and a dummy device region, the base includes an isolation layer, gate structures located on the isolation layer, a first mask layer located on the gate structures, a source-drain plug located between the gate structures and on the isolation layer, and a second mask layer located on the source-drain plug; the first mask layer on the gate structures of the dummy device region is removed, and a first opening exposing the gate structures is formed; and the second mask layer on the source-drain plug of the dummy device region is removed, and a second opening exposing the source-drain plug is formed. In embodiments and implementations of the present disclosure, the first mask layer and the second mask layer on the dummy device region are separately removed. Correspondingly, the remaining first mask layer and second mask layer expose the gate structures and the source-drain plug in the dummy device region. The gate structures exposed by the first opening and the source-drain plug exposed by the second opening are removed in the same step using the remaining first mask layer and second mask layer as masks. The gate groove at the bottom of the first opening and the source-drain groove at the bottom of the second opening are formed at the same time. A dielectric layer may be formed in the gate groove and the source-drain groove in the same step correspondingly. The dielectric layer may block the gate structures and the source-drain plug at the same time. This is advantageous for simplifying the formation process of the semiconductor structure and improving the formation efficiency of the semiconductor structure.

DETAILED DESCRIPTION

As will be appreciated from the background, currently, formed device still have poor performance problems. Reasons for the poor performance of the devices are analyzed now in combination with a method for forming a semiconductor structure.

FIG. 1 to FIG. 5 are schematic structural diagrams corresponding to all steps in a method for forming a semiconductor structure.

Figure 1:
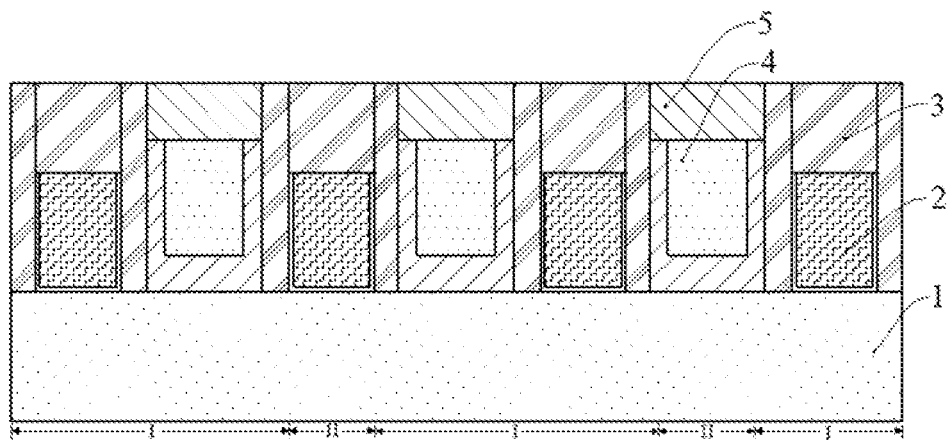
FIG. 1 to FIG. 5 are schematic structural diagrams corresponding to all steps in a method for forming a semiconductor structure.

As shown in FIG. 1, a base is provided. The base includes a device region I and a dummy device region II. The base includes an isolation layer 1, gate structures 2 located on the isolation layer 1, a first mask layer 3 located on the gate structures 2, a source-drain plug 4 located between the gate structures 2 and on the isolation layer 1, and a second mask layer 5 located on the source-drain plug 4.

Figure 2:
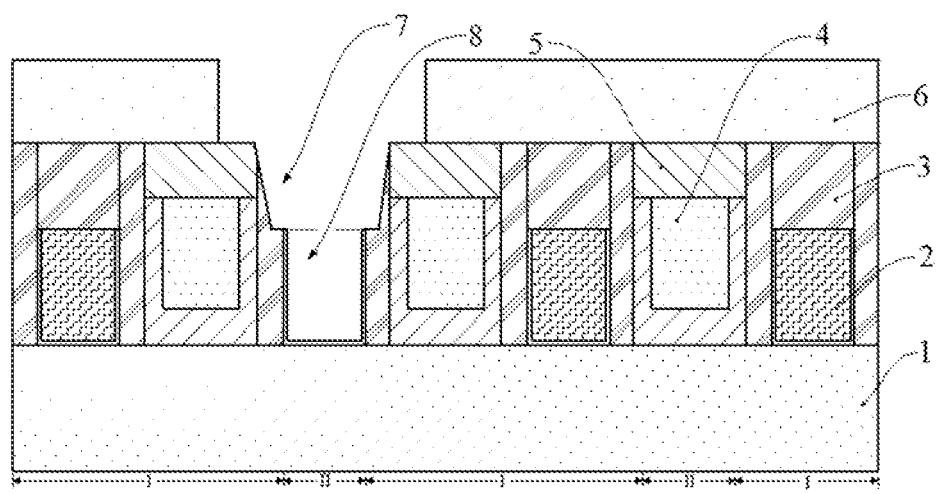

As shown in FIG. 2, a first shielding layer 6 exposing the first mask layer 3 in the dummy device region II is formed. The first mask layer 3 on the gate structures 2 of the dummy device region II is removed using the first shielding layer 6 as a mask, and a first opening 7 exposing the gate structures 2 is formed. The gate structures 2 exposed by the first opening 7 are removed, and a gate groove 8 is formed.

Figure 3:
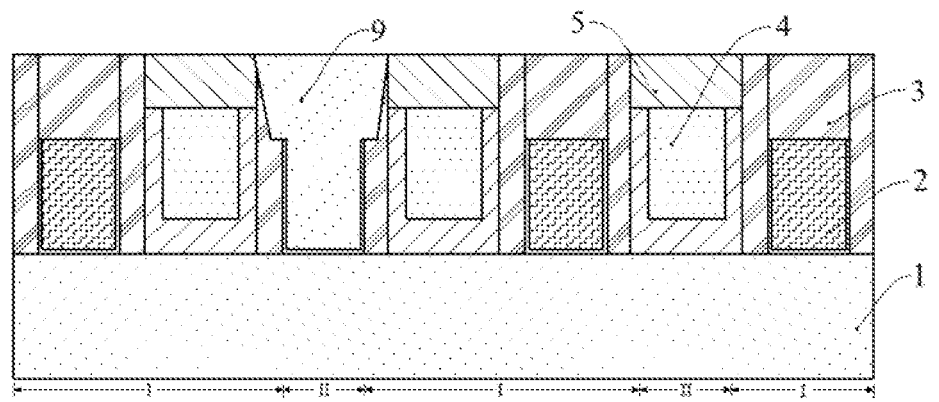

As shown in FIG. 3, a first dielectric layer 9 is formed in the first opening 7 and the gate groove 8.

Figure 4:
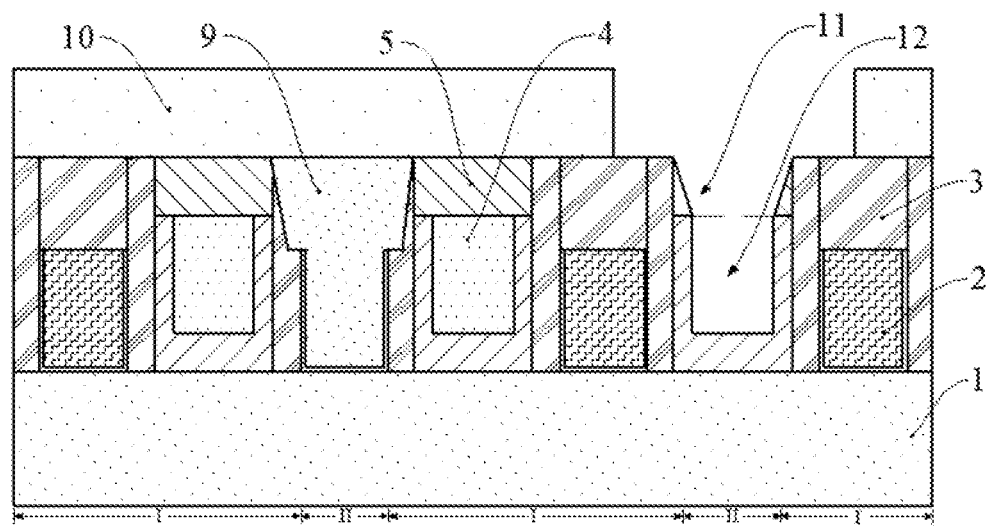

As shown in FIG. 4, a second shielding layer 10 exposing the second mask layer 5 in the dummy device region II is formed. The second mask layer 5 on the source-drain plug 4 of the dummy device region II is removed using the second shielding layer 10 as a mask, and a second opening 11 exposing the source-drain plug 4 is formed. The source-drain plug 4 exposed by the second opening 11 is removed, and a source-drain groove 12 is formed.

Figure 5:
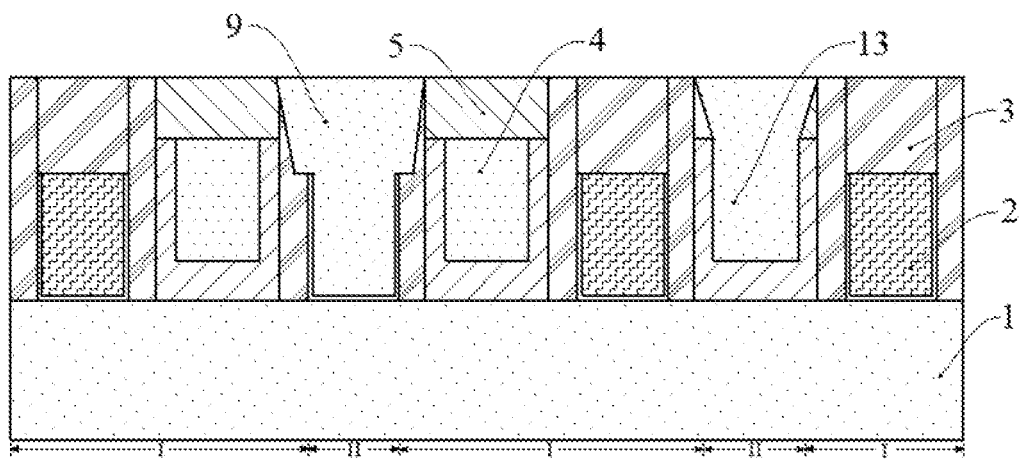

As shown in FIG. 5, a second dielectric layer 13 is formed in the gate groove 8 and the source-drain groove 12.

In an advanced semiconductor manufacturing process, a pitch between the gate structures 2 is increasingly small, and a mask of forming the first opening 7 and a mask of forming the second opening 11 are located in different layouts. The first opening 7 and the second opening 11 are formed in different steps. The gate groove 8 is formed according to the first opening 7 after the first opening 7 is formed. The source-drain groove 12 is formed according to the second opening 11 after the second opening 11 is formed. The gate groove 8 and the source-drain groove 12 are formed in different steps. Correspondingly, the first dielectric layer 9 and the second dielectric layer 13 are formed in different steps, resulting in a complex formation process of the semiconductor structure. This is disadvantageous for improving the formation efficiency of the semiconductor structure.

To address the technical problems, implementations of a method for forming a semiconductor structure includes: providing a base, the base including a device region and a dummy device region, the base including an isolation layer, gate structures located on the isolation layer, a first mask layer located on the gate structures, a source-drain plug located between the gate structures and on the isolation layer, and a second mask layer located on the source-drain plug; removing the first mask layer on the gate structures of the dummy device region, and forming, in the first mask layer, a first opening exposing the gate structures; removing the second mask layer on the source-drain plug of the dummy device region, and forming, in the second mask layer, a second opening exposing the source-drain plug; removing, using the remaining first mask layer and second mask layer as masks, the gate structures exposed by the first opening and the source-drain plug exposed by the second opening, forming a gate groove at the bottom of the first opening, and forming a source-drain groove at the bottom of the second opening; and forming a dielectric layer in the gate groove and the source-drain groove.

In implementations of the method for forming a semiconductor structure provided in the present disclosure, the base includes a device region and a dummy device region, the base includes an isolation layer, gate structures located on the isolation layer, a first mask layer located on the gate structures, a source-drain plug located between the gate structures and on the isolation layer, and a second mask layer located on the source-drain plug; the first mask layer on the gate structures of the dummy device region is removed, and a first opening exposing the gate structures is formed; and the second mask layer on the source-drain plug of the dummy device region is removed, and a second opening exposing the source-drain plug is formed. In embodiments and implementations of the present disclosure, the first mask layer and the second mask layer on the dummy device region are separately removed. Correspondingly, the remaining first mask layer and second mask layer expose the gate structures and the source-drain plug in the dummy device region. The gate structures exposed by the first opening and the source-drain plug exposed by the second opening are removed in the same step using the remaining first mask layer and second mask layer as masks. The gate groove at the bottom of the first opening and the source-drain groove at the bottom of the second opening are formed at the same time. A dielectric layer may be formed in the gate groove and the source-drain groove in the same step correspondingly. The dielectric layer may block the gate structures and the source-drain plug at the same time. This is advantageous for simplifying the formation process of the semiconductor structure and improving the formation efficiency of the semiconductor structure.

FIG. 6 to FIG. 13 are schematic structural diagrams corresponding to steps in one form of a method for forming a semiconductor structure according the present disclosure.

Figure 6:
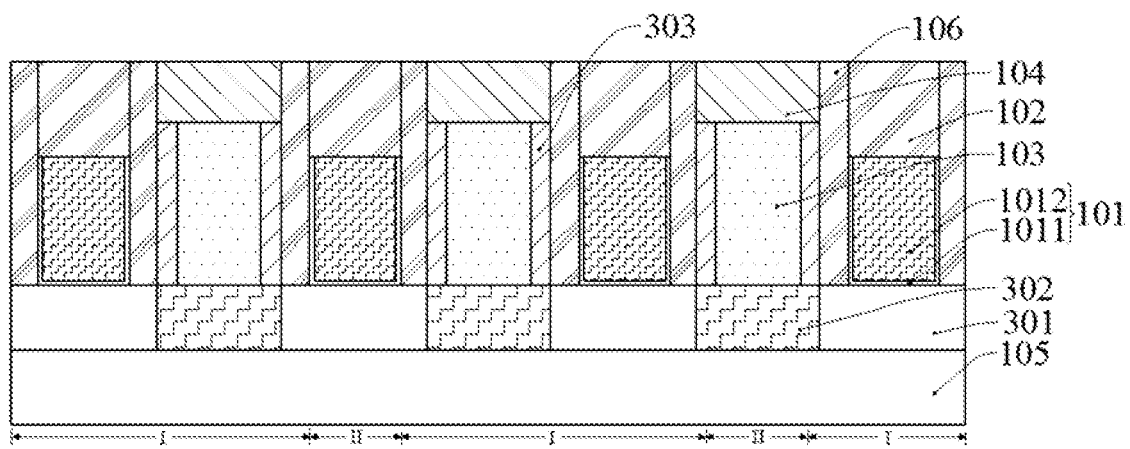
FIG. 6 to FIG. 13 are schematic structural diagrams corresponding to steps in one form of a method for forming a semiconductor structure according the present disclosure.
Figure 7:
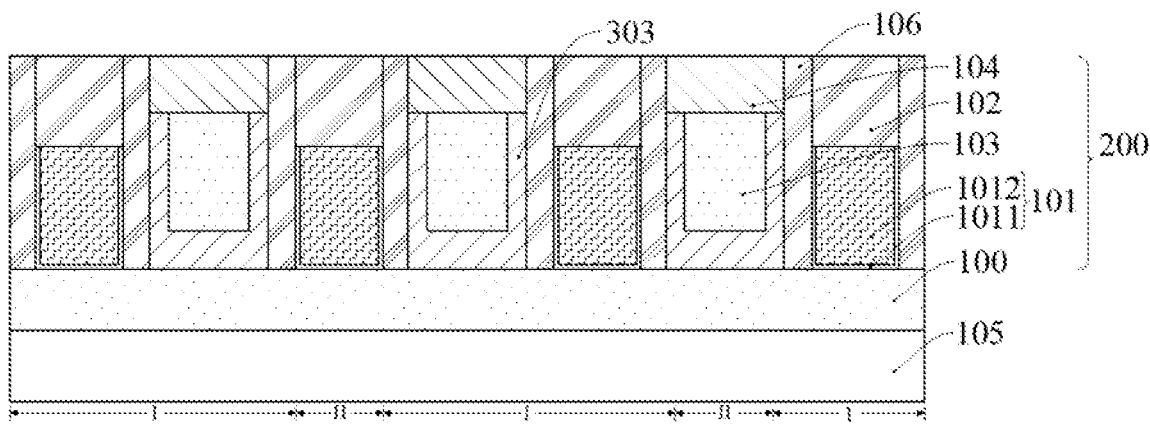

Referring to FIG. 6 and FIG. 7, FIG. 6 and FIG. 7 are cross-sectional views of different positions. A base 200 is provided. The base 200 includes a device region I and a dummy device region II. The base 200 includes an isolation layer 100, gate structures 101 located on the isolation layer 100, a first mask layer 102 located on the gate structures 101, a source-drain plug 103 located between the gate structures 101 and on the isolation layer 100, and a second mask layer 104 located on the source-drain plug 103.

In some implementations, for example, the formed semiconductor structure is a fin field effect transistor.

In the step of providing the base 200, the base 200 further includes: a substrate 105 and a fin 301 located on the substrate 105.

The substrate 105 provides a process basis for subsequently forming a semiconductor structure.

In some implementations, the substrate 105 is a silicon substrate. In other implementations, the material of the substrate may also be another material such as germanium, silicon germanide, silicon carbide, gallium arsenide, or indium gallide. The substrate may also be a substrate of another type, such as a silicon substrate on an insulator or a germanium substrate on an insulator.

The isolation layer 100 is located on the substrate 105 exposed by the fin 301, and the isolation layer 100 covers a part of side walls of the fin 301.

The isolation layer 100 is configured to isolate the gate structures 101 from the substrate 105, and configured to isolate the source-drain plug 103 from the substrate 105.

The isolation layer 100 is configured to electrically isolate adjacent devices.

In some implementations, the material of the isolation layer 100 includes silicon oxide. Silicon oxide is a dielectric material commonly used in a process and being of low cost, has high process compatibility, and is advantageous for reducing the process difficulty and process cost of forming the isolation layer 100. Furthermore, the dielectric constant of silicon oxide is relatively small, which is also advantageous for improving the function of the isolation layer 100 for isolating adjacent devices.

The gate structures 101 span the fin 301 and cover a part of a top wall and a part of side walls of the fin 301.

The gate structures 101 are configured to open or close a channel when the semiconductor structure operates.

Specifically, the material of the gate structures 101 includes metal.

In some implementations, the gate structures 101 include a work function layer 1011 and a metal gate layer 1012 located on the work function layer 1011.

The work function layer 1011 is configured to adjust a threshold voltage of a transistor when the semiconductor structure operates.

In some implementations, a material of the metal gate layer 1012 includes magnesium tungsten alloy. In other implementations, the material of the metal gate layer includes one or more of Co, Ru and W.

It should be noted that, a spacer layer 106 is formed on the side wall of the gate structures 101.

In the subsequent process of removing the first mask layer 102 on the gate structures 101, and forming the first opening exposing the gate structures 101, the spacer layer 106 is configured to limit a formation position of the first opening, so that the source-drain plug 103 between the gate structures 101 and on the isolation layer 100 is unlikely to be etched wrongly. This is advantageous for improving the electrical performance of the semiconductor structure.

A material of the spacer layer 106 is a low-k dielectric material. This is advantageous for reducing a capacitive coupling effect between the gate structures 101 and the source-drain plug 103, and improving the electrical performance of the semiconductor structure.

The material of the spacer layer 106 includes SiON, SiBCN, SiCN, carbon-doped SiN or oxygen-doped SiN. In some implementations, the material of spacer layer 106 is silicon nitride including C or N.

In the step of providing the base 200, the first mask layer 102 is configured to protect the top of the gate structures 101 from being likely to be damaged, and in the subsequent step of removing the second mask layer 104 on the top of the source-drain plug 103, an etched rate of the first mask layer 102 is less than that of the second mask layer 104. The first mask layer 102 is configured to protect the top of the gate structures 101 from being likely to be damaged. This is advantageous for improving a capability of the gate structures 101 for controlling the channel when the semiconductor structure operates, to enable the electrical performance of the semiconductor structure to be improved.

In some implementations, a material of the first mask layer 102 is a dielectric material.

Specifically, the material of the first mask layer 102 includes one or more of silicon nitride, silicon carbide, silicon carbonitride, silicon oxy-carbonitride, silicon oxynitride, boron nitride, and boron carbonitride. In some implementations, the material of the first mask layer 102 includes silicon nitride.

In the step of providing the base 200, a source-drain doped layer 302 is formed in the fin 301 on two sides of the gate structures 101. An interlayer dielectric layer 303 is formed on the source-drain doped layer 302 on two sides of the gate structures 101. A top surface of the interlayer dielectric layer 303 is lower than or flush with that of the gate structures 101. The source-drain doped layer 302 is configured to provide a stress for the channel when the semiconductor structure operates, to improve the carrier migration rate in the channel.

In some implementations, the semiconductor structure is configured to form a negative channel metal oxide semiconductor (NMOS). The source-drain doped layer 302 is silicon carbide or silicon phosphide doped with N-type ions. In some implementations, by doping the N-type ions in silicon carbide or silicon phosphide, the N-type ions replace the silicon atoms in the lattice. The more N-type ions are doped, the higher the majority-carrier concentration is, and the stronger the electrical conductivity is. In some implementations, the N-type ions include: phosphorus ions, arsenic ions, or antimony ions.

In other implementations, the semiconductor structure is configured to form a positive channel metal oxide semiconductor (PMOS). The source-drain doped layer is doped with silicon germanide of P-type ions. In some implementations, by doping the P-type ions in the silicon germanide, the P-type ions replace silicon atoms in the lattice. The more P-type ions are doped, the higher the majority-carrier concentration is, and the stronger the electrical conductivity is. In some implementations, the P-type ions include: boron ions, gallium ions, or indium ions.

The source-drain plug 103 is located on the top of the source-drain doped layer 302. The source-drain plug 103 is configured to connect to the source-drain doped layer 302.

Specifically, the source-drain plug 103 is located in the interlayer dielectric layer 303.

In some implementations, the source-drain plug 103 is a laminated structure. Specifically, the source-drain plug 103 includes a barrier layer (not shown) and a source-drain metal layer (not shown) located on the barrier layer.

The barrier layer enables the material of the source-drain plug 103 to be unlikely to diffuse into the spacer layer 106 and the interlayer dielectric layer 303, to enable the gate structures 101 to be unlikely to be bridged with the source-drain plug 103. This is advantageous for improving the electrical performance of the semiconductor structure.

Specifically, the material of the barrier layer includes one or more of TaN, Ta, Ti, TiN, ZrN, and ZrTiN. In some implementations, a material of the barrier layer is TaN.

In some implementations, a material of the source-drain metal layer includes one or more of Co, Ru and W.

In the step of providing the base 200, the second mask layer 104 is configured to protect the top of the source-drain plug 103 from being likely to be damaged, and in the subsequent step of removing the first mask layer 102 on the gate structures 101 in the dummy device region II, an etched rate of the second mask layer 104 is less than that of the first mask layer 102. The second mask layer 104 is configured to protect the top of the source-drain plug 103 from being likely to be damaged. The source-drain doped layer 302 connected to the source-drain plug 103 provides enough stress for the channel when the semiconductor structure operates, to improve the carrier migration rate in the channel, to enable the electrical performance of the semiconductor structure to be improved.

In some implementations, a material of the second mask layer 104 is a dielectric material.

Specifically, the material of the second mask layer 104 includes one or more of silicon nitride, silicon carbide, silicon carbonitride, silicon oxy-carbonitride, silicon oxynitride, boron nitride, and boron carbonitride. In some implementations, the material of the second mask layer 104 includes silicon carbide.

It should be noted that, the step of providing the base 200 includes: providing the substrate 105 and the fin 301 located on the substrate 105; forming the isolation layer 100 on the substrate 105 on a side of the fin 301, where the isolation layer 100 covers a part of side walls of the fin 301; forming, on the isolation layer 100, dummy gate structures spanning the fin 301, where the dummy gate structures cover a part of a top wall and a part of side walls of the fin 301; forming the source-drain doped layer 302 in the fin 301 on two sides of the dummy gate structures; forming the interlayer dielectric layer 303 on the source-drain doped layer 302 on sides of the dummy gate structures, where a top surface of the interlayer dielectric layer 303 is lower than or flush with those of the dummy gate structures; removing the dummy gate structures, and forming a gate opening in the interlayer dielectric layer 303; forming the gate structures 101 in the gate opening; etching back the gate structures 101 having a partial thickness, and forming a first groove on the top of the gate structures 101; forming the first mask layer in the first groove; etching the interlayer dielectric layer 303, and forming, in the interlayer dielectric layer 303, a second groove exposing the source-drain doped layer 302; forming the source-drain plug 103 in the second groove; and etching back the source-drain plug 103 having a partial thickness, and forming the second mask layer on the top of the source-drain plug 103.

Figure 8:
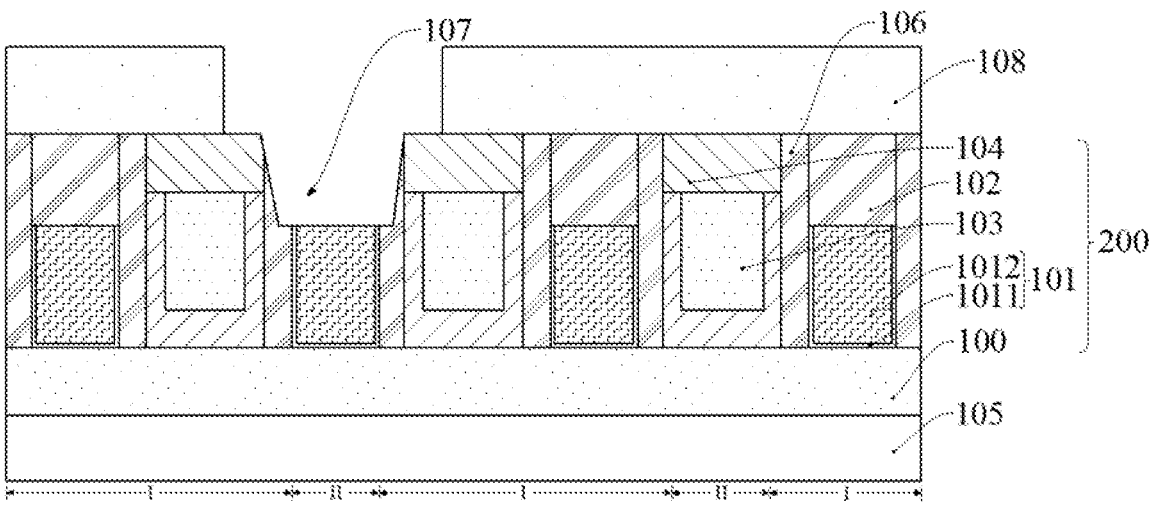
Figure 9:
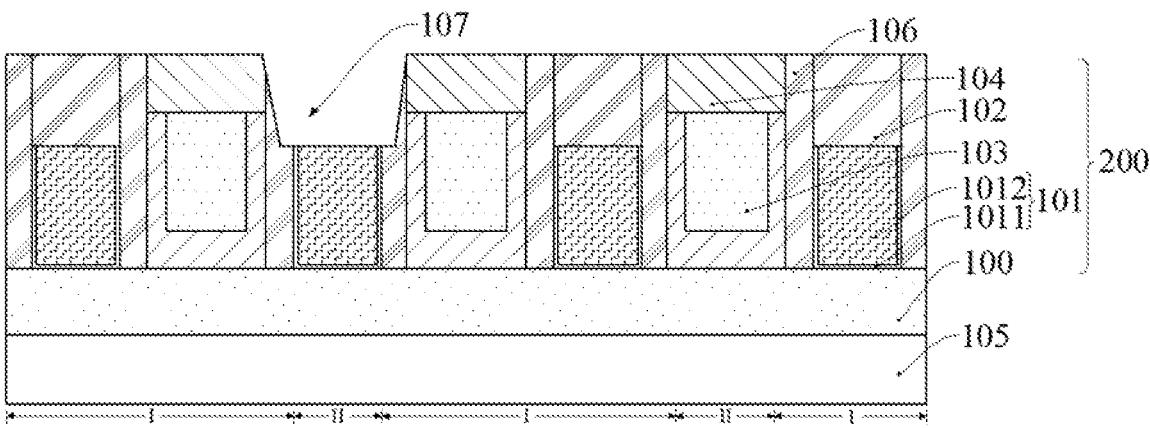

Referring to FIG. 8 and FIG. 9, FIG. 8 and FIG. 9 are schematic diagrams based on the cross-section in FIG. 7. The first mask layer 102 on the gate structures 101 of the dummy device region II is removed. A first opening 107 exposing the gate structures 101 is formed in the first mask layer 102.

The first opening 107 prepares for the subsequent formation of a gate groove disconnecting from the gate structures 101.

In the step of removing the first mask layer 102 on the gate structures 101 of the dummy device region II, the etched rate of the first mask layer 102 is greater than that of the second mask layer 104. The second mask layer 104 may protect the top of the source-drain plug 103 from being likely to be damaged. The source-drain doped layer 302 connected to the source-drain plug 103 provides an enough stress for the channel when the semiconductor structure operates, to improve the carrier migration rate in the channel, to enable the electrical performance of the semiconductor structure to be improved.

In some implementations, the first mask layer 102 on the gate structures 101 of the dummy device region II is removed using a dry etching process, and the first opening 107 exposing the gate structures 101 is formed. The dry etching process is characterized by anisotropic etching, has good control on the etching profile, and causes less damage to the second mask layer 104 on a side of the first mask layer 102 in the process of etching the first mask layer 102. This helps the morphology of the first opening 107 to meet process requirements, is unlikely to cause damage to the source-drain plug 103, and prepares for the subsequent removing of the gate structures 101 in the dummy device region II.

The step of forming the first opening 107 includes: forming a first shielding layer 108 that covers the device region I and exposes the first mask layer 102 in the dummy device region II, and removing the first mask layer 102 in the dummy device region II by using the first shielding layer 108 as a mask.

The first shielding layer 108 is made of a material that can be easily removed, so that damage to the remaining first mask layer 102 and second mask layer 104 may be reduced when the first shielding layer 108 is subsequently removed.

A material of the first shielding layer 108 is an organic material, such as a bottom anti-reflective coating (BARC) material, an organic dielectric layer (ODL) material, a photoresist, a dielectric anti-reflective coating (DARC) material, a deep UV light absorbing oxide (DUO) material, or an advanced patterning film (APF) material. In some implementations, the material of the first shielding layer 108 includes the photoresist.

The method for forming a semiconductor structure further includes: as shown in FIG. 9, removing the first shielding layer 108 after the first mask layer 102 in the dummy device region II is removed.

In some implementations, the first shielding layer 108 is removed using an ashing process.

Figure 10:
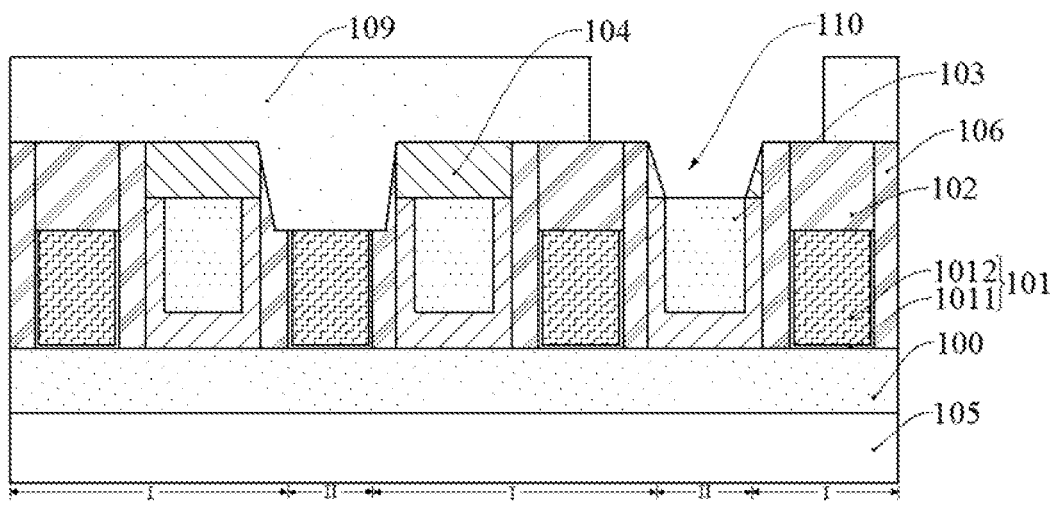
Figure 11:
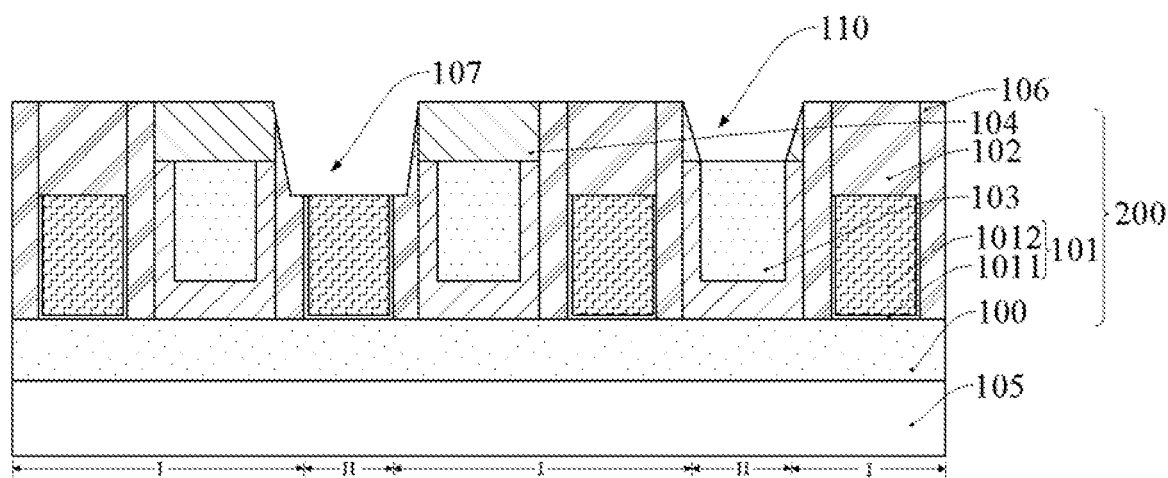

Referring to FIG. 10 and FIG. 11, the second mask layer 104 on the source-drain plug 103 of the dummy device region II is removed, and the second opening 110 exposing the source-drain plug 103 is formed.

The second opening 110 prepares for the subsequent formation of a source-drain groove disconnecting from the source-drain plug 103.

In the step of removing the second mask layer 104 on the source-drain plug 103 of the dummy device region II, the etched rate of the second mask layer 104 is greater than that of the first mask layer 102. The first mask layer 102 is configured to protect the top of the gate structures 101 from being likely to be damaged. This is advantageous for improving a capability of the gate structures 101 for controlling the channel when the semiconductor structure operates, to enable the electrical performance of the semiconductor structure to be improved.

In some implementations, the second mask layer 104 on the source-drain plug 103 of the dummy device region II is removed using the dry etching process, and the second opening 110 exposing the source-drain plug 103 is formed. The dry etching process is characterized by anisotropic etching, has good control on the etching profile, and causes less damage to the first mask layer 102 on a side of the second mask layer 104 in the process of etching the second mask layer 104. This helps the morphology of the second opening 110 to meet process requirements, and prepares for the subsequent removing of the source-drain plug 103 in the dummy device region II.

The step of forming the second opening 110 includes: forming a second shielding layer 109 that covers the first opening 107 and the device region I and exposes a second mask layer 104 in the dummy device region II, and removing the second mask layer 104 in the dummy device region II by using the second shielding layer 109 as a mask.

The second shielding layer 109 is made of a material that can be easily removed, so that damage to the first mask layer 102 and the second mask layer 104 may be reduced when the second shielding layer 109 is subsequently removed.

A material of the second shielding layer 109 is an organic material, such as, a BARC material, an ODL material, a photoresist, a DARC material, a DUO material or an APF material. In some implementations, the material of the second shielding layer 109 includes the photoresist.

The method for forming a semiconductor structure further includes: as shown in FIG. 11, removing the second shielding layer 109 after the second mask layer 104 in the dummy device region II is removed.

In some implementations, the second shielding layer 109 is removed using an ashing process.

Figure 12:
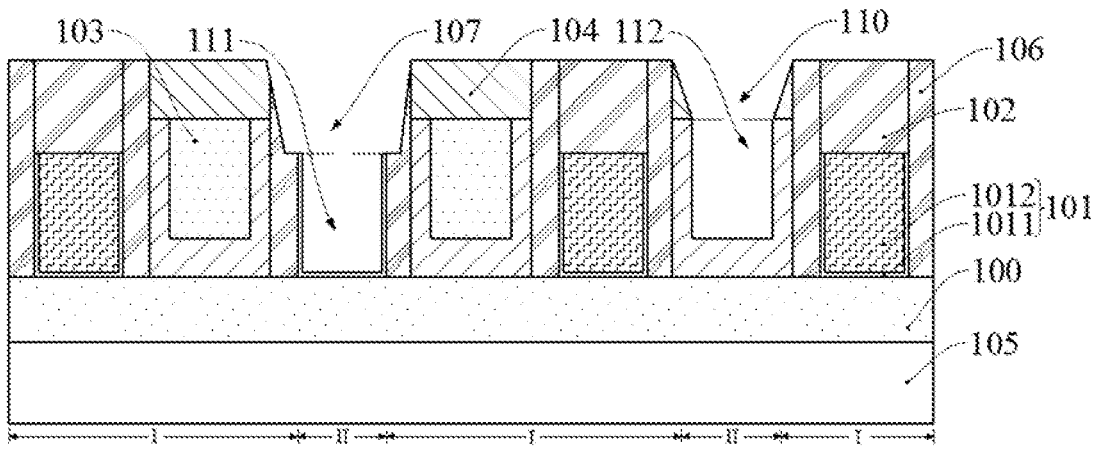

Referring to FIG. 12, the gate structures 101 exposed by the first opening 107 and the source-drain plug 103 exposed by the second opening 110 are removed using the remaining first mask layer 102 and second mask layer 104 as masks. A gate groove 111 is formed at the bottom of the first opening 107. A source-drain groove 112 is formed at the bottom of the second opening 110.

The base 200 includes a device region I and a dummy device region II, the base 200 includes an isolation layer 100, gate structures 101 located on the isolation layer 100, a first mask layer 102 located on the gate structures 101, a source-drain plug 103 located between the gate structures 101 and on the isolation layer 100, and a second mask layer 104 located on the source-drain plug 103; the first mask layer 102 on the gate structures 101 of the dummy device region II is removed, and a first opening 107 exposing the gate structures 101 is formed; and the second mask layer 104 on the source-drain plug 103 of the dummy device region II is removed, and a second opening 110 exposing the source-drain plug 103 is formed. In embodiments and implementations of the present disclosure, the first mask layer 102 and the second mask layer 104 on the dummy device region II are separately removed. Correspondingly, the remaining first mask layer 102 and second mask layer 104 expose the gate structures 101 and the source-drain plug 103 in the dummy device region II. The gate structures 101 exposed by the first opening 107 and the source-drain plug 103 exposed by the second opening 110 are removed in the same step using the remaining first mask layer 102 and second mask layer 104 as masks. The gate groove 111 at the bottom of the first opening 107 and the source-drain groove 112 at the bottom of the second opening 110 are formed at the same time. A dielectric layer may be formed in the gate groove 111 and the source-drain groove 112 in the same step. The dielectric layer may block the gate structures 101 and the source-drain plug 103 at the same time. This is advantageous for simplifying the formation process of the semiconductor structure and improving the formation efficiency of the semiconductor structure.

The gate groove 111 and the source-drain groove 112 provide a process space for the subsequent formation of the dielectric layer.

In the step of etching the gate structures 101 using the first mask layer 102 and the second mask layer 104 as masks, an etched rate of the gate structures 101 is greater than etched rates of the first mask layer 102 and the second mask layer 104.

In the step of etching the source-drain plug 103 using the first mask layer 102 and the second mask layer 104 as masks, an etched rate of the source-drain plug 103 is greater than etched rates of the first mask layer 102 and the second mask layer 104.

In some implementations, by using the remaining first mask layer 102 and second mask layer 104 as masks, the gate structures 101 exposed by the first opening 107 and the source-drain plug 103 exposed by the second opening 110 are removed using a dry etching process. The dry etching process is characterized by anisotropic etching. Etched regions are likely to be limited to the regions exposed by the first opening 107 and the second opening 110. The dry etching process has good control on the etching profile. This helps morphologies of the gate groove 111 and the source-drain groove 112 to meet process requirements. The gate structures 101 may be disconnected by the gate groove 111. The source-drain plug 103 may be disconnected by the source-drain groove 112. In some implementations, the materials of the gate structures 101 and the source-drain plug 103 include metal. The gate structures 101 and the source-drain plug 103 exposed by the first opening 107 and the second opening 110 are etched using the dry etching process. This is advantageous for simplifying the formation processes of the source-drain groove 112 and the gate groove 111 and improving the formation efficiency of the semiconductor structure.

Process parameters of removing, using the remaining first mask layer 102 and second mask layer 104 as masks, the gate structures 101 exposed by the first opening 107 and the source-drain plug 103 exposed by the second opening 110 include: an etching gas including one or two of $CH_3F$ and $SF_6$; a flow rate of the etching gas being in a range of 50 sccm to 500 sccm; an auxiliary gas including $O_2$; a chamber pressure being in a range of 5 mTorr to 200 mTorr; and an etching power being in a range of 50 W to 500 W.

It should be noted that, the flow rate of the etching gas should neither be too large nor be too small. If the flow rate of the etching gas is too large, a relatively high etched rate is likely to be generated, the gate structures 101 and the source-drain plug 103 in the device region I are likely to be wrongly etched, a capability of the gate structures 101 for controlling the channel is relatively weak when the semiconductor structure operates, and a current in the source-drain plug 103 is unstable. As a result, the stress provided by the source-drain doped layer 302 for the channel is relatively weak, the carrier migration rate in the channel is relatively small, and the electrical performance of the semiconductor structure is not good. If the flow rate of the etching gas is too small, removal rates of the gate structures 101 exposed by the first opening 107 and the source-drain plug 103 exposed by the second opening 110 are too low. This is disadvantageous for improving the formation efficiency of the semiconductor structure. In some implementations, the flow rate of the etching gas is in a range of 50 sccm to 500 sccm.

The auxiliary gas $O_2$ is used for increasing etching selection ratios of the gate structures 101 to the first mask layer 102 as well as the second mask layer 104, and etching selection ratios of the source-drain plug 103 to the first mask layer 102 as well as the second mask layer 104 in the etching process, so that the gate structures 101 and the source-drain plug 103 under the first mask layer 102 and the second mask layer 104 in the device region I are unlikely to be damaged. This is advantageous for improving the electrical performance of the semiconductor structure.

It should be noted that, the chamber pressure should neither be too large nor be too small. If the chamber pressure is too small, a density of plasma of the etching gas in a chamber is relatively low. This easily leads to relatively low etched rates of the gate structures 101 exposed by the first opening 107 and the source-drain plug 103 exposed by the second opening 110, and is disadvantageous for improving the formation efficiency of the source-drain groove 112 and the gate groove 111. If the chamber pressure is too large, a decomposition rate of by-products generated in the etching process is too low, and correspondingly, a rate at which the by-products are discharged from the chamber is too low. As a result, the morphologies of the source-drain groove 112 and the gate groove 111 are not good. In addition, if the chamber pressure is too large, removal rates of the gate structures 101 exposed by the first opening 107 and the source-drain plug 103 exposed by the second opening 110 are also likely to be high, and process controllability and reaction rate uniformity of etching are likely to be lowered, resulting in poor process stability. In some implementations, the chamber pressure is in a range of 10 mTorr to 300 mTorr.

It should be noted that, the etching power should neither be too large nor be too small. If the etching power is too large, removal rates of the gate structures 101 exposed by the first opening 107 and the source-drain plug 103 exposed by the second opening 110 are high, and process controllability and reaction rate uniformity of etching are likely to be lowered, resulting in poor process stability. If the etching power is too small, too much process time needs to be spent in forming the source-drain groove 112 and the gate groove 111. In some implementations, the etching power is in a range of 50 W to 500 W.

Figure 13:
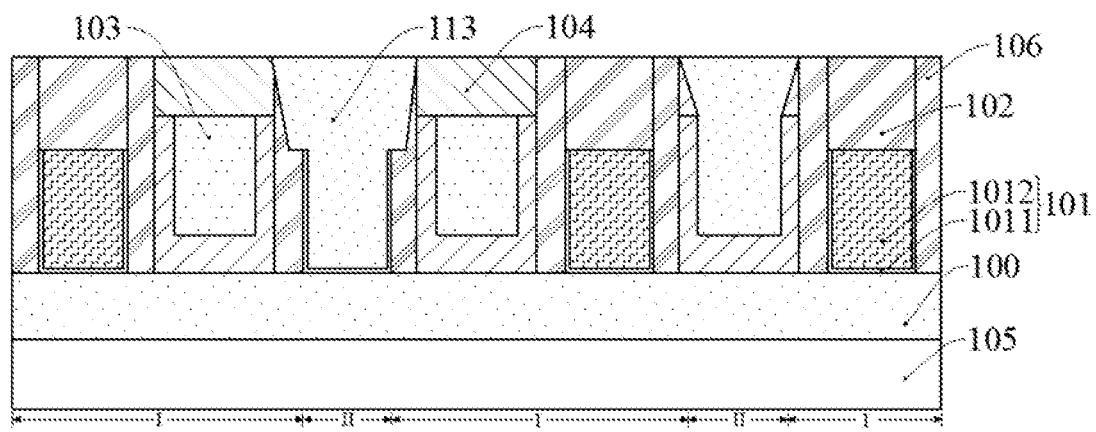

Referring to FIG. 13, a dielectric layer 113 is formed in the gate groove 111 and the source-drain groove 112.

The dielectric layer 113 in the gate groove 111 is configured to electrically isolate the gate structures 101 on two sides of the dummy device region II and in the device region I. The dielectric layer 113 in the source-drain groove 112 is configured to electrically isolate the source-drain plug 103 on two sides of the dummy device region II and in the device region I.

It should be noted that, in the step of forming the dielectric layer 113 in the gate groove 111 and the source-drain groove 112, the dielectric layer 113 is further formed in the first opening 107 and the second opening 110.

In some implementations, the material of the dielectric layer 113 includes silicon oxide.

The step of forming the dielectric layer 113 in the gate groove 111 and the source-drain groove 112 includes: forming a dielectric material layer on the gate groove 111, the source-drain groove 112, the first opening 107, the second opening 110, the first mask layer 102 and the second mask layer 104; and removing the dielectric material layer higher than the first mask layer 102 and the second mask layer 104, where the remaining dielectric material layer located in the gate groove 111, source-drain groove 112, the first opening 107, and the second opening 110 is used as the dielectric layer 113.

In some implementations, the dielectric material layer is formed using a flowable chemical vapor deposition (FCVD) process. The FCVD process has good filling capability, is suitable for filling an opening of a high aspect ratio, is advantageous for reducing the probability that defects such as empty holes are formed in the dielectric material layer, and is correspondingly advantageous for improving the film formation quality of the dielectric layer 113.

The method for forming a semiconductor structure further includes: forming a gate plug (not shown) on the top of the gate structures after the dielectric layer 113 is formed.

The gate plug is formed above the gate structures 101 of an AA. Therefore, a portion that is of the gate structures 101 and that is located on the dummy device region II is saved. This is advantageous for saving an area of a chip, and further reducing a size of the chip, thereby improving integration of the semiconductor structure.

In some implementations, a material of the gate plug is copper. The low resistivity of copper is advantageous for reducing an RC signal delay at a later stage and improving a processing speed of a chip, and is further advantageous for reducing a resistance of the gate plug, which correspondingly reduces the power consumption. In other implementations, the material of the gate plug may be further tungsten or cobalt.

The step of forming a gate plug includes: forming an inter-metal dielectric (IMD) layer on the first mask layer 102, the second mask layer 104, and the dielectric layer 113 after the dielectric layer 113 is formed; forming, in the IMD layer, a third opening exposing the top of the gate structures 101; forming a gate contact material layer on the third opening and the IMD layer; and removing the gate contact material layer higher than the IMD layer, where the remaining gate contact material layer located in the third opening is used as the gate plug.

In some implementations, the gate contact material layer is formed using an electroplating (ECP) process. In other implementations, the gate contact material layer may alternatively be formed using a metal-organic chemical vapor deposition (MOCVD) process.

In some implementations, the gate contact material layer higher than the IMD layer is removed using a chemical mechanical planarization (CMP) process. The CMP is a global surface planarization technology. The CMP process can precisely and evenly remove the IMD layer located on the first mask layer 102 and the second mask layer 104. This is advantageous for improving the flatness of the top surface of the gate plug.

Another form of the present disclosure provides a semiconductor structure. FIG. 11 is a schematic structural diagram of one form of a semiconductor structure according to the present disclosure.

The semiconductor structure includes a base 200. The base 200 includes a device region I and a dummy device region II. The base 200 includes an isolation layer 100, gate structures 101 located on the isolation layer 100, a first mask layer 102 located on the gate structures 101, a source-drain plug 103 located between the gate structures 101 and on the isolation layer 100, and a second mask layer 104 located on the source-drain plug 103; a first opening 107, located in the first mask layer 102, where the first opening 107 exposes the gate structures 101 of the dummy device region II, and a second opening 110, located in the second mask layer 104, where the second opening 110 exposes the source-drain plug 103 of the dummy device region II.

In the semiconductor structure provided in embodiments and implementations of the present disclosure, the first opening 107 is located in the first mask layer 102. The first opening 107 exposes the gate structures 101 of the dummy device region II. The second opening 110 is located in the second mask layer 104. The second opening 110 exposes the source-drain plug 103 of the dummy device region II. Subsequently, the gate structures 101 exposed by the first opening 107 and the source-drain plug 103 exposed by the second opening 110 are removed in the same step using the remaining first mask layer 102 and second mask layer 104 as masks. In addition, a gate groove is formed at the bottom of the first opening 107, and a source-drain groove is formed at the bottom of the second opening 110. In the same step, a dielectric layer is formed in the gate groove and the source-drain groove. This is advantageous for simplifying the formation process of the semiconductor structure and improving the formation efficiency of the semiconductor structure. In addition, generally, the gate structures 101 and the source-drain plug 103 exposed by the first opening 107 and the second opening 110 are etched using the dry etching process. This is advantageous for simplifying the formation processes of the source-drain groove and the gate groove and improving the formation efficiency of the semiconductor structure.

In some implementations, for example, the formed semiconductor structure is a fin field effect transistor.

The base 200 further includes: a substrate 105 and a fin 301 (as shown in FIG. 6) located on the substrate 105.

In some implementations, the substrate 105 is a silicon substrate. In other implementations, the material of the substrate may also be another material such as germanium, silicon germanide, silicon carbide, gallium arsenide, or indium gallide. The substrate may also be a substrate of another type, such as a silicon substrate on an insulator or a germanium substrate on an insulator.

The isolation layer 100 is located on the substrate 105 exposed by the fin 301, and the isolation layer 100 covers a part of side walls of the fin 301.

The isolation layer 100 is configured to isolate the gate structures 101 from the substrate 105 at the bottom of the isolation layer 100, and configured to isolate the source-drain plug 103 from the substrate 105 at the bottom of the isolation layer 100.

The isolation layer 100 is configured to electrically isolate adjacent devices.

In some implementations, the material of the isolation layer 100 includes silicon oxide. Silicon oxide is a dielectric material commonly used in a process and being of low cost, has high process compatibility, and is advantageous for reducing the process difficulty and process cost of forming the isolation layer 100. Furthermore, the dielectric constant of silicon oxide is relatively small, which is also advantageous for improving the function of the isolation layer 100 for isolating adjacent devices.

The gate structures 101 span the fin 301 and cover a part of a top wall and a part of side walls of the fin 301.

The gate structures 101 are configured to open or close a channel when the semiconductor structure operates.

Specifically, the material of the gate structures 101 includes metal.

In some implementations, the gate structures 101 include a work function layer 1011 and a metal gate layer 1012 located on the work function layer 1011.

The work function layer 1011 is configured to adjust a threshold voltage of a transistor when the semiconductor structure operates.

In some implementations, a material of the metal gate layer 1012 includes magnesium tungsten alloy. In other implementations, the material of the metal gate layer includes one or more of Co, Ru and W.

It should be noted that, a spacer layer 106 is formed on the side wall of the gate structures 101.

The spacer layer 106 is configured to limit a formation position of the first opening, so that the source-drain plug 103 between the gate structures 101 and on the isolation layer 100 is unlikely to be etched wrongly. This is advantageous for improving the electrical performance of the semiconductor structure.

A material of the spacer layer 106 is a low-k dielectric material. This is advantageous for reducing a capacitive coupling effect between the gate structures 101 and the source-drain plug 103, and improving the electrical performance of the semiconductor structure.

The material of the spacer layer 106 includes SiON, SiBCN, SiCN, carbon-doped SiN or oxygen-doped SiN. In some implementations, the material of spacer layer 106 is silicon nitride including C or N.

In the step of forming the second opening 110, the first mask layer 102 is configured to protect the top of the gate structures 101 from being likely to be damaged. An etched rate of the first mask layer 102 is less than that of the second mask layer 104. The first mask layer 102 is configured to protect the top of the gate structures 101 from being likely to be damaged. This is advantageous for improving a capability of the gate structures 101 for controlling the channel when the semiconductor structure operates, to enable the electrical performance of the semiconductor structure to be improved.

In some implementations, a material of the first mask layer 102 is a dielectric material.

Specifically, the material of the first mask layer 102 includes one or more of silicon nitride, silicon carbide, silicon carbonitride, silicon oxy-carbonitride, silicon oxynitride, boron nitride, and boron carbonitride. In some implementations, the material of the first mask layer 102 includes silicon nitride.

The base 200 further includes: a source-drain doped layer 302 (as shown in FIG. 6) located in the fin 301 on two sides of the gate structures 101.

The source-drain doped layer 302 is configured to provide a stress for the channel when the semiconductor structure operates, to improve the carrier migration rate in the channel.

In some implementations, the semiconductor structure is configured to form a negative channel metal oxide semiconductor (NMOS). The source-drain doped layer 302 is silicon carbide or silicon phosphide doped with N-type ions. In some implementations, by doping the N-type ions in silicon carbide or silicon phosphide, the N-type ions replace the silicon atoms in the lattice. The more N-type ions are doped, the higher the majority-carrier concentration is, and the stronger the electrical conductivity is. In some implementations, the N-type ions include: phosphorus ions, arsenic ions, or antimony ions.

In other implementations, the semiconductor structure is configured to form a positive channel metal oxide semiconductor (PMOS). The source-drain doped layer is doped with silicon germanide of P-type ions. In some implementations, by doping P-type ions in silicon germanide, P-type ions replace the positions of silicon atoms in the lattice, the more P-type ions are doped, the higher the concentration of free electrons is, and the stronger the conductivity is. In some implementations, the P-type ions include: boron ions, gallium ions, or indium ions.

The source-drain plug 103 is located on the top of the source-drain doped layer 302. The source-drain plug 103 is configured to connect to the source-drain doped layer 302.

The base 200 further includes: an interlayer dielectric layer 303 (as shown in FIG. 6) located on the source-drain doped layer 302 on sides of the gate structures 101. In addition, a top surface of the interlayer dielectric layer 303 is lower than or flush with that of the gate structures 101.

Specifically, the source-drain plug 103 is located in the interlayer dielectric layer 303.

In some implementations, the source-drain plug 103 is a laminated structure. Specifically, the source-drain plug 103 includes a barrier layer (not shown) and a source-drain metal layer (not shown) located on the barrier layer.

The barrier layer enables the material of the source-drain plug 103 to be unlikely to diffuse into the spacer layer 106 and the interlayer dielectric layer 303, to enable the gate structures 101 to be unlikely to be bridged with the source-drain plug 103. This is advantageous for improving the electrical performance of the semiconductor structure.

Specifically, the material of the barrier layer includes one or more of TaN, Ta, Ti, TiN, ZrN, and ZrTiN. In some implementations, a material of the barrier layer is TaN.

In some implementations, a material of the source-drain metal layer includes one or more of Co, Ru and W.

In the step of forming the first opening 107, the second mask layer 104 is configured to protect the top of the source-drain plug 103 from being likely to be damaged. An etched rate of the second mask layer 104 is less than that of the first mask layer 102. The second mask layer 104 is configured to protect the top of the source-drain plug 103 from being likely to be damaged. The source-drain doped layer 302 connected to the source-drain plug 103 provides an enough stress for the channel when the semiconductor structure operates, to improve the carrier migration rate in the channel, to enable the electrical performance of the semiconductor structure to be improved.

In some implementations, a material of the second mask layer 104 is a dielectric material.

Specifically, the material of the second mask layer 104 includes one or more of silicon nitride, silicon carbide, silicon carbonitride, silicon oxy-carbonitride, silicon oxynitride, boron nitride, and boron carbonitride. In some implementations, the material of the first mask layer 102 includes silicon carbide.

The first opening 107 prepares for the subsequent formation of a gate groove disconnecting from the gate structures 101.

In the step of forming the first opening 107, the etched rate of the first mask layer 102 is greater than that of the second mask layer 104. The second mask layer 104 may protect the top of the source-drain plug 103 from being likely to be damaged. The source-drain doped layer 302 connected to the source-drain plug 103 provides an enough stress for the channel when the semiconductor structure operates, to improve the carrier migration rate in the channel, to enable the electrical performance of the semiconductor structure to be improved.

The second opening 110 prepares for the subsequent formation of a source-drain groove disconnecting from the source-drain plug 103.

In the step of forming the second opening 110, the etched rate of the second mask layer 104 is greater than that of the first mask layer 102. The first mask layer 102 is configured to protect the top of the gate structures 101 from being likely to be damaged. This is advantageous for improving a capability of the gate structures 101 for controlling the channel when the semiconductor structure operates, to enable the electrical performance of the semiconductor structure to be improved.

The semiconductor structure may be formed by adopting the forming method described in the foregoing embodiments and implementations, or may be formed by adopting other forming methods. For specific descriptions for the semiconductor structure of this embodiment, reference may be made to corresponding descriptions in the foregoing embodiment. Details are not described herein again in this embodiment.

Although embodiments and implementations of the present disclosure have been disclosed above, the embodiments and implementations of the present disclosure are not limited thereto. A person skilled in the art may make variations and modifications without departing from the spirit and scope of the embodiments of the present disclosure. Therefore, the protection scope of the embodiments and implementations of the present disclosure should be subject to the appended claims.

What is claimed is:

1. A method for forming a semiconductor structure, comprising:
    providing a base comprising:
    a device region,
    a dummy device region,
    an isolation layer,
    gate structures located on the isolation layer,
    a first mask layer located on the gate structures,
    a source-drain plug located between the gate structures and on the isolation layer, and
    a second mask layer located on the source-drain plug;
    removing the first mask layer on the gate structures located on the isolation layer that are in the dummy device region, and forming, in the first mask layer, a first opening exposing the gate structures located on the isolation layer that are in the dummy device region;
    removing the second mask layer on the source-drain plug located in the dummy device region, and forming, in the second mask layer, a second opening exposing the source-drain plug located in the dummy device region;
    removing, using the remaining first mask layer and second mask layer as masks, the gate structures exposed by the first opening and the source-drain plug exposed by the second opening, forming a gate groove at a bottom of the first opening, and forming a source-drain groove at a bottom of the second opening; and
    forming a dielectric layer in the gate groove and the source-drain groove.

2. The method for forming a semiconductor structure according to claim 1, wherein the first mask layer on the gate structures located on the isolation layer that are in the dummy device region is removed using a dry etching process.

3. The method for forming a semiconductor structure according to claim 1, wherein in the step of removing the first mask layer on the gate structures located on the isolation layer that are in the dummy device region, an etched rate of the first mask layer is greater than that of the second mask layer.

4. The method for forming a semiconductor structure according to claim 1, wherein a material of the first mask layer comprises at least one of silicon nitride, silicon carbide, silicon carbonitride, silicon oxy-carbonitride, silicon oxynitride, boron nitride, or boron carbonitride.

5. The method for forming a semiconductor structure according to claim 1, wherein the second mask layer on the source-drain plug located in the dummy device region is removed using a dry etching process.

6. The method for forming a semiconductor structure according to claim 1, wherein in the step of removing the second mask layer on the source-drain plug located in the dummy device region, an etched rate of the second mask layer is greater than that of the first mask layer.

7. The method for forming a semiconductor structure according to claim 1, wherein a material of the second mask layer comprises at least one of silicon nitride, silicon carbide, silicon carbonitride, silicon oxy-carbonitride, silicon oxynitride, boron nitride, or boron carbonitride.

8. The method for forming a semiconductor structure according to claim 1, wherein:
    the step of removing the first mask layer on the gate structures located on the isolation layer that are in the dummy device region, and forming a first opening comprises:
        forming a first shielding layer that covers the device region and exposes the first mask layer in the dummy device region; and
        removing the first mask layer in the dummy device region using the first shielding layer as a mask; and
    the method for forming a semiconductor structure further comprises: removing the first shielding layer after the first mask layer in the dummy device region is removed.

9. The method for forming a semiconductor structure according to claim 1, wherein:
    the first opening is formed, and the second opening is formed after the first opening is formed;
    the step of removing the second mask layer on the source-drain plug located in the dummy device region and forming the second opening comprises:
        forming a second shielding layer that covers the first opening and the device region and exposes the second mask layer in the dummy device region; and
        removing the second mask layer in the dummy device region using the second shielding layer as a mask; and
    the method for forming a semiconductor structure further comprises: removing the second shielding layer after the second mask layer in the dummy device region is removed.

10. The method for forming a semiconductor structure according to claim 1, wherein, using the remaining first mask layer and second mask layer as masks, the gate structures exposed by the first opening and the source-drain plug exposed by the second opening are removed using a dry etching process.

11. The method for forming a semiconductor structure according to claim 10, wherein process parameters of removing, using the first mask layer and the second mask layer as masks, the gate structures exposed by the first opening and the source-drain plug exposed by the second opening comprise:
   an etching gas comprising one or two of $CH_3F$ and $SF_6$;
   a flow rate of the etching gas being in a range of 50 sccm to 500 sccm;
   an auxiliary gas comprising $O_2$;
   a chamber pressure being in a range of 5 mTorr to 200 mTorr; and
   an etching power being in a range of 50 W to 500 W.

12. The method for forming a semiconductor structure according to claim 1, wherein the base further comprises:
   a substrate;
   a fin, located on the substrate, wherein:
      the isolation layer is located on the substrate on a side of the fin, and the isolation layer covers a part of side walls of the fin; and
      the gate structures, on the isolation layer, span the fin and cover a part of a top wall and a part of side walls of the fin;
   a source-drain doped layer, located in the fin on two sides of the gate structures, where the source-drain plug is located on the top of the source-drain doped layer; and
   an interlayer dielectric layer, located on the source-drain doped layer on sides of the gate structures, and a top surface of the interlayer dielectric layer is lower than or flush with that of the gate structures.

13. The method for forming a semiconductor structure according to claim 1, further comprising: forming a gate plug on the top of the gate structures after the dielectric layer is formed.

14. The method for forming a semiconductor structure according to claim 1, wherein a material of the gate structures comprises metal.

* * * * *